(12) United States Patent
Bolken et al.

(10) Patent No.: US 7,459,773 B2
(45) Date of Patent: Dec. 2, 2008

(54) STACKABLE BALL GRID ARRAY

(75) Inventors: Todd O. Bolken, Meridian, ID (US);
Cary J. Baerlocher, Meridian, ID (US);
Chad A. Cobbley, Boise, ID (US);
David J. Corisis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 88 days.

(21) Appl. No.: 11/268,095

(22) Filed: Nov. 7, 2005

(65) Prior Publication Data
US 2006/0055020 A1    Mar. 16, 2006

Related U.S. Application Data

(60) Division of application No. 10/761,739, filed on Jan. 21, 2004, now Pat. No. 7,019,408, which is a continuation of application No. 09/586,050, filed on Jun. 2, 2000, now Pat. No. 6,778,404.

(51) Int. Cl.
*H01L 23/02* (2006.01)
(52) U.S. Cl. ............... 257/686; 257/777; 257/737; 257/738; 257/686; 361/735; 361/790; 361/767; 438/106; 438/109
(58) Field of Classification Search ......... 257/685–686, 257/777–778, 723, 676, 737–738, 797, E23.179; 361/767, 735, 736, 790, 803; 438/106, 109
See application file for complete search history.

(56) References Cited

U.S. PATENT DOCUMENTS

| 5,222,014 | A | | 6/1993 | Lin ..................... 361/414 |
|---|---|---|---|---|
| 5,598,033 | A | | 1/1997 | Behlen et al. ............ 257/686 |
| 5,748,452 | A | | 5/1998 | Londa ..................... 361/790 |
| 5,781,415 | A | * | 7/1998 | Itoh ......................... 361/790 |
| 5,783,870 | A | | 7/1998 | Mostafazadeh et al. ..... 257/791 |
| 5,861,666 | A | | 1/1999 | Bellaar ..................... 257/686 |
| 5,988,511 | A | * | 11/1999 | Schmidt et al. ............ 235/492 |
| 6,050,832 | A | | 4/2000 | Lee et al. ..................... 439/91 |
| 6,172,419 | B1 | | 1/2001 | Kinsman ..................... 257/737 |
| 6,218,202 | B1 | | 4/2001 | Yew et al. ..................... 438/15 |
| 6,297,960 | B1 | * | 10/2001 | Moden et al. ............... 361/719 |
| 6,331,939 | B1 | | 12/2001 | Corisis et al. ............... 361/784 |
| 6,424,031 | B1 | * | 7/2002 | Glenn ....................... 257/686 |
| 6,504,241 | B1 | * | 1/2003 | Yanagida ................... 257/686 |
| 6,515,356 | B1 | * | 2/2003 | Shin et al. .................. 257/678 |
| 6,518,659 | B1 | * | 2/2003 | Glenn ....................... 257/704 |
| 6,778,404 | B1 | * | 8/2004 | Bolken et al. ............... 361/767 |

\* cited by examiner

*Primary Examiner*—Phuc T Dang
*Assistant Examiner*—Thanh Y Tran
(74) *Attorney, Agent, or Firm*—Fletcher Yoder

(57) ABSTRACT

A memory package having a plurality of vertically stacked ball grid arrays. Each of the vertically stacked ball grid arrays has a memory chip coupled thereto. Further, each of the plurality of ball grid arrays includes non-metal mateable alignment features. Each of the plurality of ball grid arrays is coupled to another of the plurality of ball grid arrays to from the vertically stacked memory package.

13 Claims, 6 Drawing Sheets

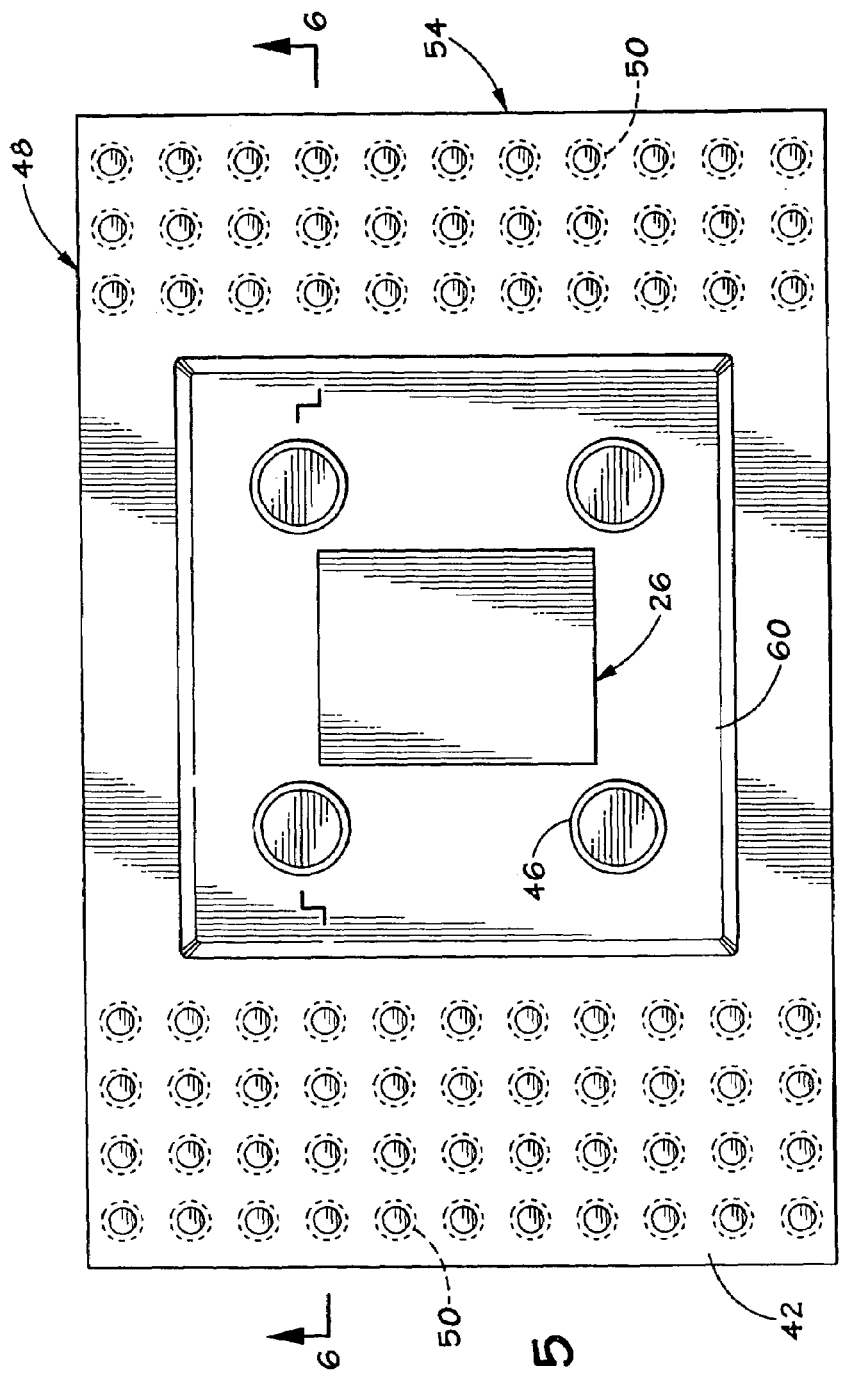
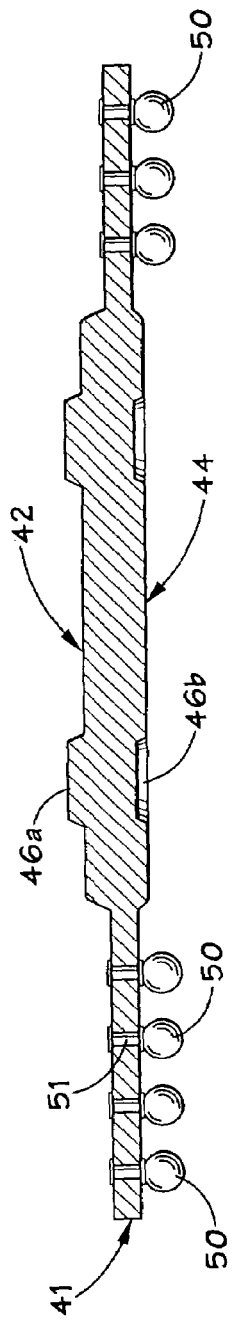
FIG. 5
FIG. 6

… (US 7,459,773 B2)

STACKABLE BALL GRID ARRAY

CROSS REFERENCES TO RELATED APPLICATIONS

The present application is a divisional of U.S. application Ser. No. 10/761,739, filed Jan. 21, 2004 now U.S. Pat No. 7,019,408 which is a continuation of U.S. application Ser. No. 09/586,050, filed Jun. 2, 2000, now U.S. Pat. No. 6,778,404 B1, which issued on Aug. 17, 2004.

BACKGROUND OF THE INVENTION

1. Field of the Invention

The present invention relates generally to electrical circuitry and, more particularly, to a stackable packaging system using ball grid array technology.

2. Description of the Related Art

Packaging of electrical circuits is a key element in the technological development of any device containing electrical components. Fine-Pitch Surface Mount Technology (FPT) and Pin Grid Array (PGA) technology are well developed areas of packaging technology. An emerging packaging method has been developed using Ball Grid Array (BGA) technology.

BGA technology offers several advantages over FPT and PGA. Among the most often cited advantages of BGA are: reduced co-planarity problems, since there are no leads; reduced placement problems; reduced paste printing problems; reduced handling damage; smaller size; better electrical and thermal performance; better package yield; better board assembly yield; higher interconnect density; multilayer interconnect options; higher I/Os for a given footprint; easier extension to multichip modules; and faster design-to-production cycle time.

While BGA technology provides many benefits, there is still a growing demand for more component functionality in a smaller space. Despite the benefits provided by BGA technology, BGA is still a surface mount technology like FPT and PGA and, thus, is limited by the space available on the mounting surface. Significant research and development has been devoted to finding ways to get more and more capabilities into smaller areas. Engineers have been challenged with finding ways to increase hardware capabilities, with memory capacity being one area in which board geography is at a particular premium is memory. However, regardless of whether FPT, PGA or BGA is implemented, surface mount technologies are limited by the space available on the ceramic substrate or printed circuit board (PCB). As a result, the amount of memory will disadvantageously be limited by the dimensions of the mounting surface.

The present invention may address one or more of the problems set forth above.

SUMMARY OF THE INVENTION

Certain aspects commensurate in scope with the originally claimed invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

In accordance with one aspect of the present invention, there is provided a memory package comprising a plurality of vertically stacked ball grid arrays and a plurality of memory chips. Each of the plurality of ball grid arrays comprises a plurality of non-metal mateable alignment features. Further, each of the plurality of ball grid arrays is coupled to another of the plurality of ball grid arrays. Each of the plurality of memory chips is coupled to a respective one of the plurality of ball grid arrays.

In accordance with another aspect of the present invention, there is provided A memory package comprising a plurality of vertically stacked packages and a plurality of memory chips. Each of the plurality of vertically stacked packages comprises a plurality of non-metal mateable alignment features. Further, each of the plurality of vertically stacked packages is coupled to another of the plurality of vertically stacked packages. Each of the plurality of memory chips is coupled to a respective one of the plurality of vertically stacked packages.

Thus, the present invention allows for increased memory capacity without requiring additional surface area on the ceramic substrate or printed circuit board to which the memory devices are electrically coupled.

BRIEF DESCRIPTION OF THE DRAWINGS

The foregoing and other advantages of the invention may become apparent upon reading the following detailed description and upon reference to the drawings in which:

FIG. 5 illustrates top view of a single stackable ball grid array;

FIG. 6 illustrates a cross-sectional view taken along line 6-6 of FIG. 5;

DESCRIPTION OF SPECIFIC EMBODIMENTS

Figure 1:
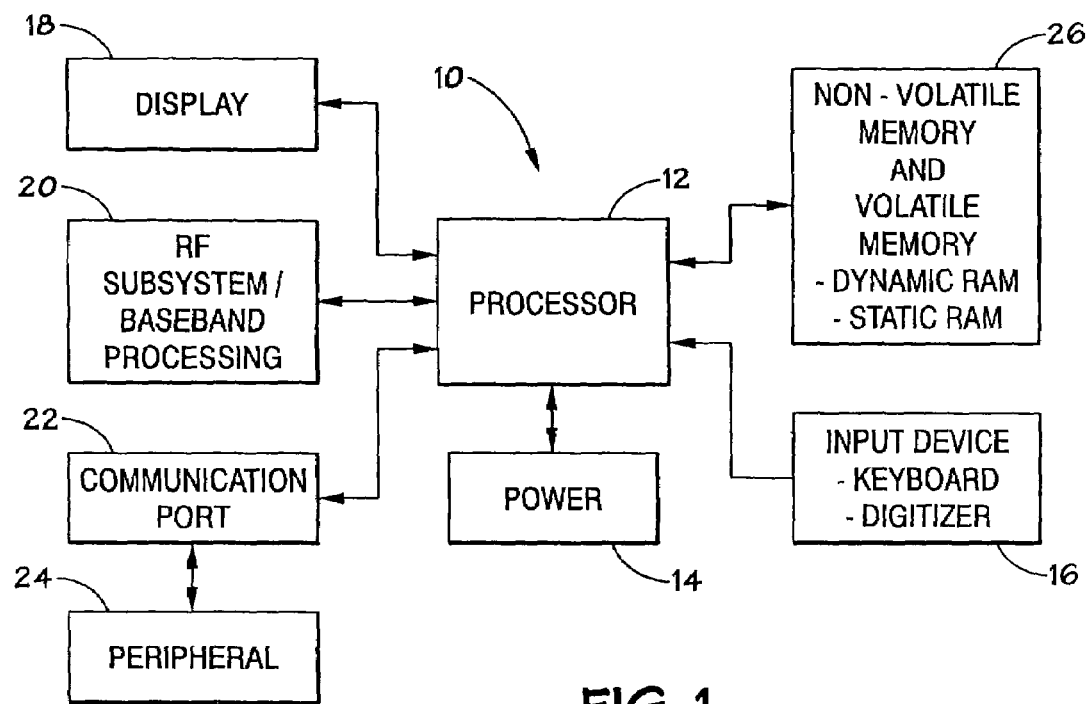
FIG. 1 illustrates a block diagram of an exemplary processor-based device in accordance with the present invention.

Turning now to the drawings, and referring initially to FIG. 1, a block diagram depicting an exemplary processor-based device generally designated by the reference numeral 10 is illustrated. The device 10 may be any of a variety of different types, such as a computer, pager, cellular telephone, personal organizer, control circuit, etc. In a typical processor-based device, a processor 12, such as a microprocessor, controls many of the functions of the device 10.

The device 10 typically includes a power supply 14. For instance, if the device 10 is portable, the power supply 14 would advantageously include permanent batteries, replaceable batteries, and/or rechargeable batteries. The power supply 14 may also include an AC adapter, so the device may be plugged into a wall outlet, for instance. In fact, the power supply 14 may also include a DC adapter, so that the device can be plugged into a vehicle cigarette lighter, for instance.

Various other devices may be coupled to the processor 12 depending upon the functions that the device 10 performs. For instance, a user interface 16 may be coupled to the processor 12. The user interface 16 may include buttons, switches, a keyboard, a light pen, a mouse, and/or a voice recognition system, for instance. A display 18 may also be coupled to the processor 12. The display 18 may include an LCD display, a CRT, LEDs, and/or an audio display, for example. Furthermore, an RF subsystem/baseband processor 20 may also be coupled to the processor 12. The RF subsystem/baseband processor 20 may include an antenna that is coupled to an RF receiver and to an RF transmitter (not shown). A communications port 22 may also be coupled to the processor 12. The communications port may be adapted to be coupled to a peripheral device 24, such as a modem, a printer, or a computer, for instance, or to a network, such as a local area network, remote area network, intranet, or the Internet, for instance. Memory 26 may also be coupled to the processor 12.

Figure 2:
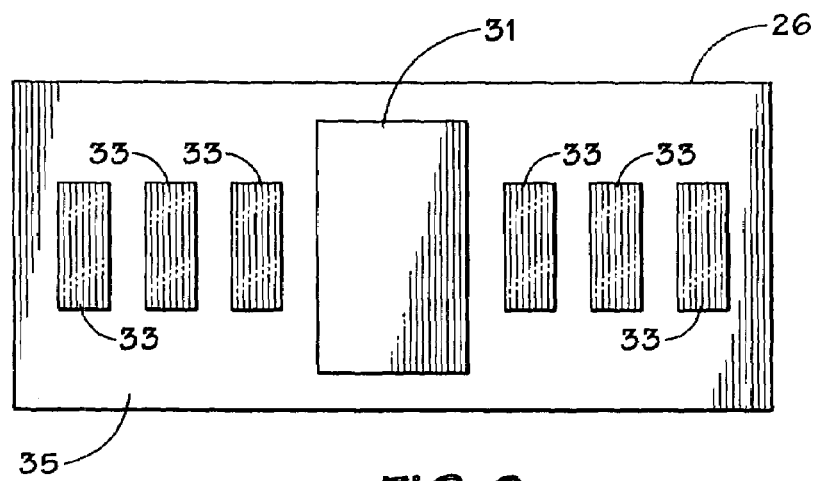
FIG. 2 illustrates an exemplary conventional memory array.

FIG. 2 illustrates a conventional multichip memory array 30. In this arrangement, a memory controller 31 is coupled to a plurality of memory devices 33. The memory controller 31 and the memory devices 33 are mounted in a planar fashion on the same substrate 35, such as a printed circuit board. Disadvantageously, this planar layout allows for only a limited number of memory devices 33 to be used depending on the surface area of the substrate 35.

Figure 3:
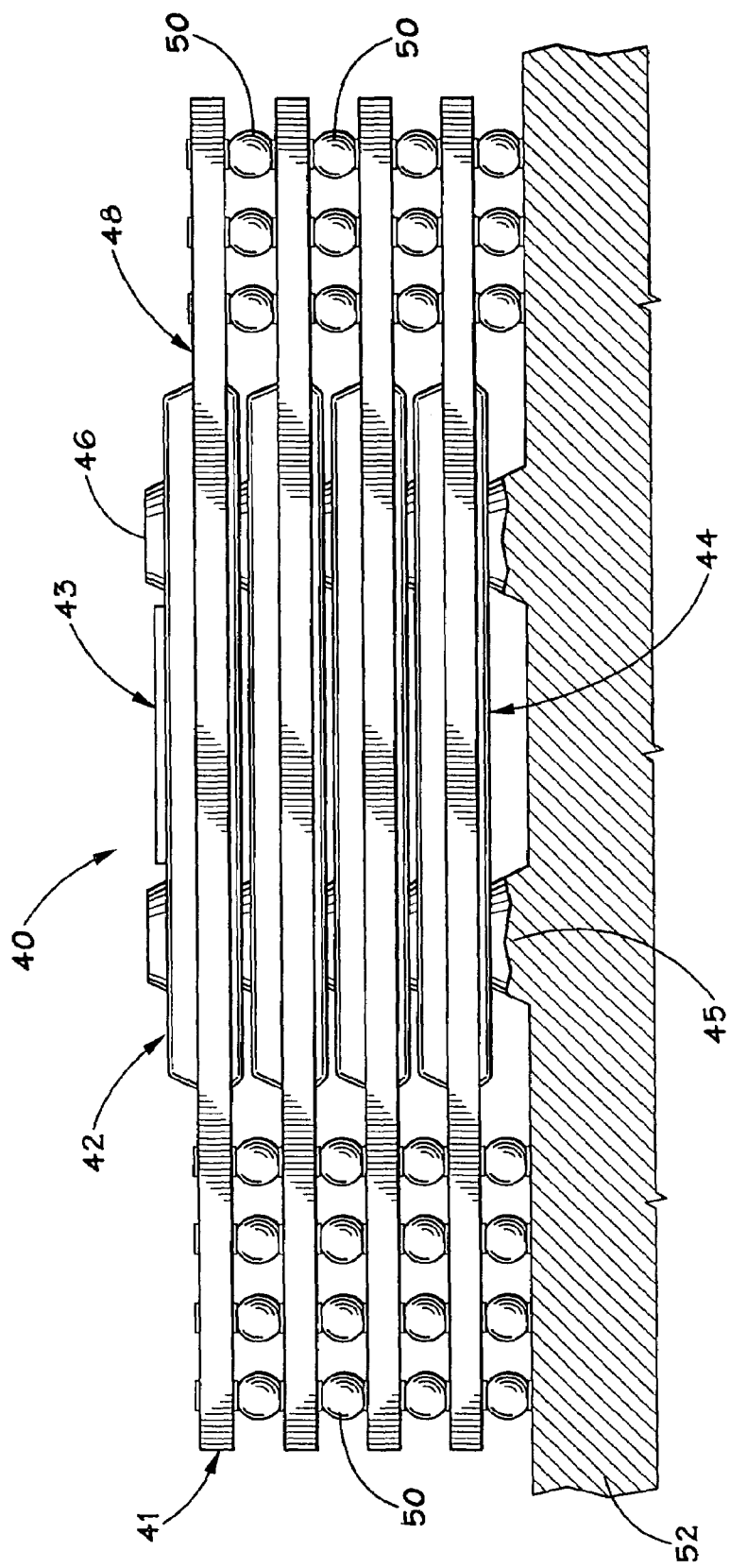
FIG. 3 illustrates a side view of a stacked ball grid array (SBGA) in accordance with the present invention.
Figure 4:
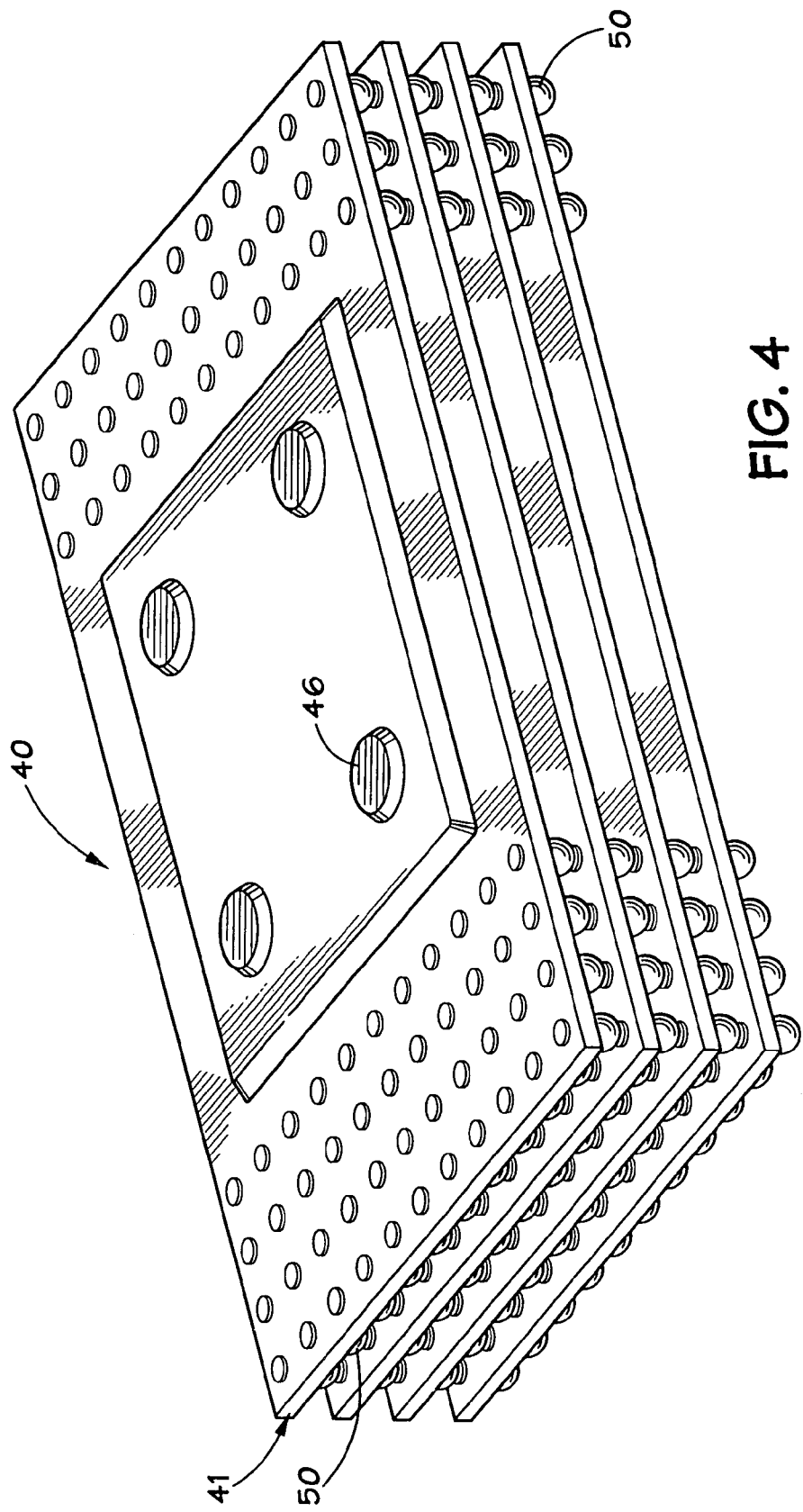
FIG. 4 represents an isometric view of the SBGA of FIG. 3.

To address this shortcoming, FIGS. 3 and 4 illustrate a stacked ball grid array (SBGA) 40. The SBGA 40 includes a plurality of stackable ballgrid array packages 41 that may be stacked one on top of the other. In one embodiment, each package 41 may be made of a structural dielectric, such as a molded resin. Each package 41 typically has a die side 42 and a ball side 44. The die side 42 of the package 41 is the chip-mounting surface of the package 41. In an advantageous embodiment, one or more chips 43, such as a memory chip and/or a microprocessor chip, may be mounted on the die side 42 of the package 41. It should be understood that the chip(s) 43 may be fully encapsulated, partially encapsulated, or bare, depending upon the specific application intended for the package 41. The die side 42 may also contain alignment features 46, as described hereinafter. The ball side 44 of the package 41 includes solder balls 50. The solder balls 50 are electrically coupled to the chip 43 through vias 51 (illustrated in FIG. 6) and/or traces (not illustrated) in the interposer regions 48 of each package 41. The solder balls 50 may be used for adhesion, as well as electrical conductivity. The ball side 44 may also contain alignment features 46, as described hereinafter.

In one embodiment, the package 41 contains alignment features 46 on both the die side 42 and the ball side 44 of package 41, thereby facilitating stacking of packages 41 in a stable manner. The alignment features 46 ensure that each package 41 is aligned with each adjacent package 41 as the packages 41 are stacked. These alignment features 46 may also support the weight of the package 41 during reflow of the solder balls 50 to maintain stack height and parallelism between packages 41. Further, the alignment features 46 may be used to orient the packages 41 as described hereinafter.

Referring again to FIG. 3, the SBGA 40 may be attached to a substrate 52, such as a printed circuit board. In fact, the SBGA 40 may be aligned using alignment features 45 which are located on the substrate 52. The SBGA 40 is electrically coupled to the substrate 52 through the solder balls 50 located on the ball side 44 of the package 41 disposed on the substrate 52.

It should be appreciated that each package 41 may contain electrical routing, such as the vias 51 illustrated in FIG. 6 for example, connected to at least some of the solder balls 50 so that electrical signals can pass serially from one package 41 to the next. For example, it may be desirable in certain applications to route signals common to each package, such as $V_{cc}$ and ground, serially through the stack of packages 41. In other applications, it may be desirable to route all signals serially through the stack of packages 41. In one embodiment, for instance, each memory chip 43 may be enabled singularly. That is, only one memory chip 43 in the SBGA 40 will be used at one time so that the selected chip 43 utilizes the signals received by the SBGA 40. With memory chips 43 mounted on the packages 41 and connected through the vias 51 and solder balls 50, the SBGA 40 forms a three dimensional memory array. As memory requirements for a system increase, more memory devices 43 can be added by adding more packages 41 to the stack, without increasing the amount of surface area required on the substrate 52. Indeed, it should be appreciated that the height of the stack of packages 41 is primarily determined by the thickness of the interposer regions 48 and the diameter of the solder balls 50.

FIG. 5 illustrates the package 41 as seen from the die side 42. As can be seen, a memory chip 43 can be mounted within the alignment features 46. In one embodiment, the interposer regions 48 containing the solder balls 50 may be located on opposing sides of the region containing the memory die 43 and the alignment features 46. In this embodiment, the solder balls 50 are arranged in four columns by eleven rows on one side of the die region 60 and in three columns by eleven rows on the other side of the die region 60. However, it should be appreciated that alternate solder ball 50 arrangements can be used. For example, the solder balls 50 may be arranged in any suitable row and column configuration in the interposer regions 48 or around the entire perimeter of the package 41.

Figure 7A:
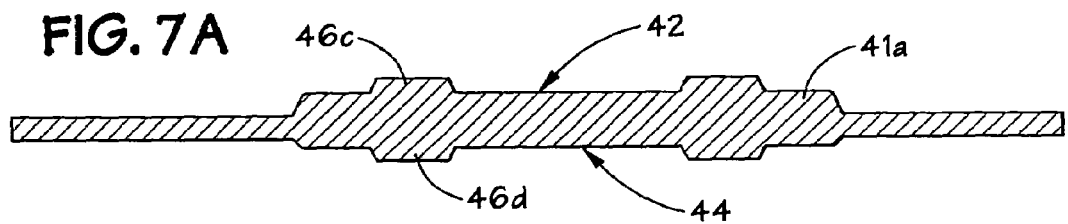
FIGS. 7A, 7B, and 7C illustrate cross-sectional views along line 6-6 of alternate configurations of alignment features.
Figure 7B:
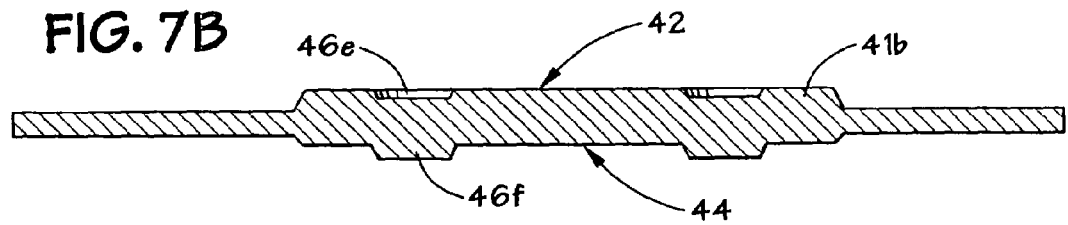
Figure 7C:
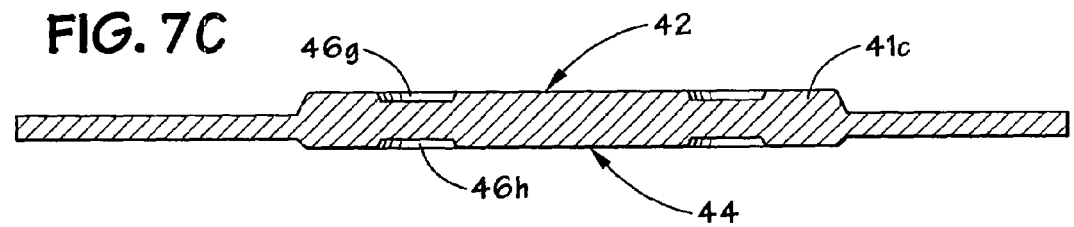
Figure 8A:
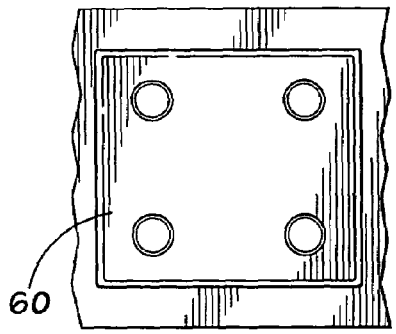
FIGS. 8A, 8B, 8C and 8D illustrate top views of alternate orientation feature configurations.
Figure 8B:
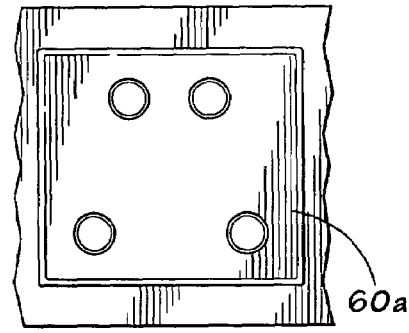
Figure 8C:
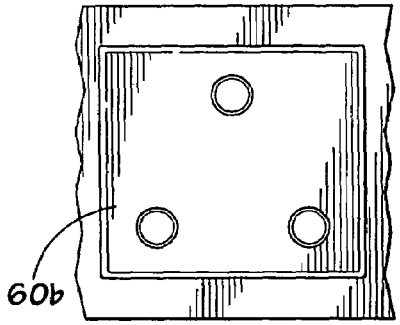
Figure 8D:
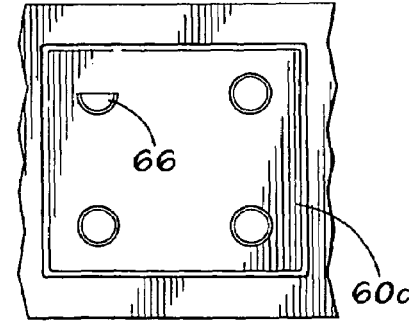

FIG. 6 illustrates a cross-sectional view of a single package 41 taken along line 6-6 in FIG. 5. In this illustration, the die side 42 of the package 41 includes male alignment features 46a, while the wire side 44 of the package 41 includes complimentary female alignment features 46b. However, it should be appreciated that alternate package configurations may be used. As illustrated in FIG. 7A, the die side 42 of the package 41a may contain male alignment features 46c, and the ball side 44 may contain male alignment features 46d. Another package configuration 41b contains female alignment features 46e on the die side 42, and complimentary male alignment features 46f on the ball side 44 of the package 41b, as illustrated in FIG. 7B. Still another package configuration 41c contains female alignment features 46g on the die side 42, and female alignment features 46h on the ball side 44 of the package 41c, as illustrated in FIG. 7C. In regard to the packages illustrated in FIGS. 6 and 7B, the same type of packages may be stacked to form an SBGA. In regard to the packages illustrated in FIGS. 7A and 7C, these types of packages may be stacked in an alternating fashion to form an SBGA.

As previously described, each package 41 typically contains some arrangement of solder balls 50 arranged on the ball side 44. In a previously described embodiment, the number of columns of solder balls 50 is different on each side of the memory die 43 to help prevent user error in stacking the packages 41 to create the SBGA 40. In this configuration, the orientation features 46 may be arranged symmetrically about the chip 43 with little likelihood of stacking the packages 41 in error. However, in an alternate embodiment, the solder balls 50 may be arranged symmetrically about chip 43. In this instance, the alignment features 46 can be arranged asymmetrically in order to insure that the packages 41 are oriented correctly and to prevent stacking errors in building the SBGA 40. Alignment refers to the positioning of one package 41 with respect to another package 41 or substrate 52 while orientation refers to the rotational positioning of a package 41 about an axis which is perpendicular to the substrate 52. Proper alignment and orientation are typically desirable to insure electrical conductivity from one package 41 to the next.

FIGS. 8A, 8B, 8C, and 8D illustrate alternate alignment feature configurations which provide an orientation function. As previously described, the alignment features 46 may be arranged symmetrically about the die region 60. An alternate configuration of region 60a may arrange the alignment features 46 asymmetrically about the side 42. Still another alignment feature configuration 60b may use a different number of alignment features 46 arranged asymmetrically about the perimeter of the die region 60b. Still another alignment feature configuration 60c, may introduce a different shape to one of the alignment features 46 in order to prevent any stacking errors. By using asymmetrical feature configuration, or using one uniquely shaped alignment feature 66, each package 41 will have only one position in which it can be properly coupled to another package 41 or mounting surface 52. Thus, the risk of improperly placing the package 41 is greatly reduced.

Figure 9:
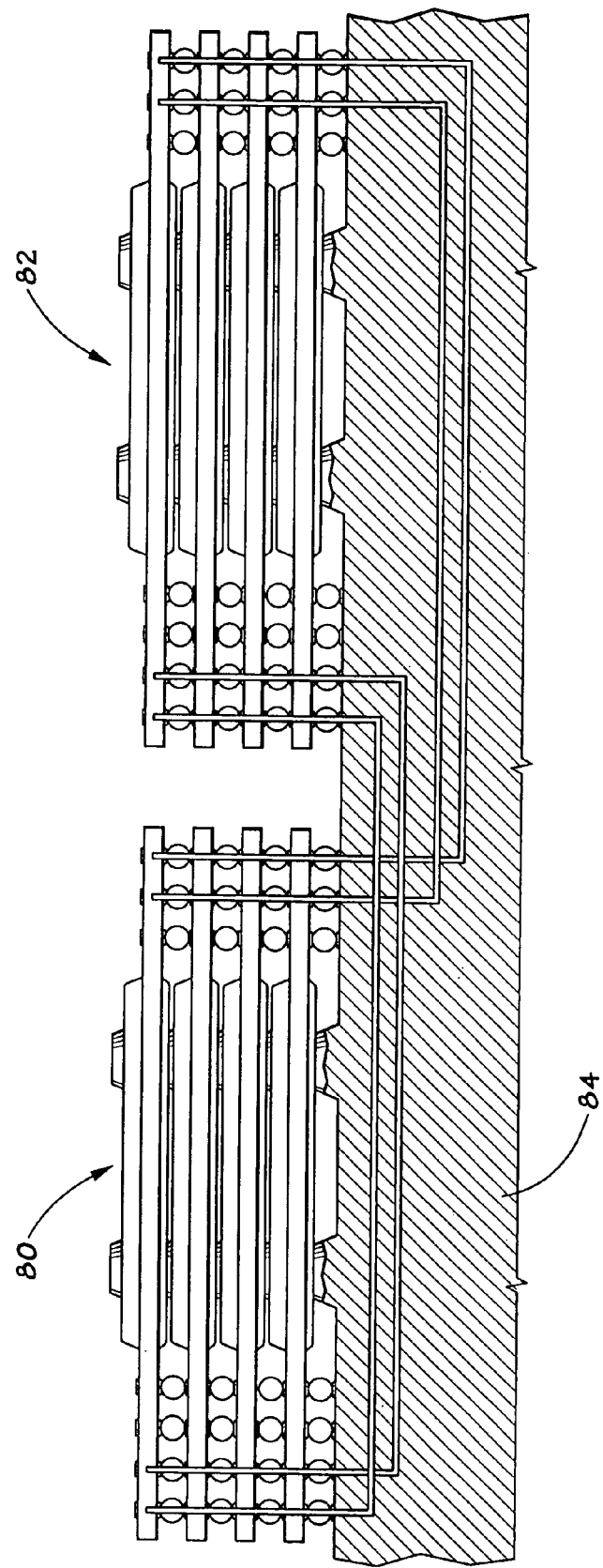
FIG. 9 illustrates two SBGAs electrically coupled together.

While a single SBGA 40 has been described, it should be appreciated that more than one SBGA 40 may be used in a given device 10. As illustrated in FIG. 9, one SBGA 80 may be coupled to one or more SBGAs, such as the SBGA 82, on a substrate 84 through a shunt circuit or through some low impedance element, such as a metal trace on the substrate 84. Typically, all such SBGAs 80 and 82 are serially connected. By coupling a plurality of SBGAs together, a device 10 may further exploit the advantages of added performance capabilities within the confines of a discrete surface area.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A memory package comprising:
    a plurality of vertically stacked ball grid arrays, wherein each of the plurality of ball grid arrays comprises a plurality of non-metal mateable alignment features, and wherein each of the plurality of ball grid arrays is coupled to another of the plurality of ball grid arrays; and
    a plurality of memory chips, wherein each of the plurality of memory chips is coupled to a respective one of the plurality of ball grid arrays.

2. The memory package, as set forth in claim 1, wherein each of the plurality of vertically stacked ball grid arrays comprises a molded resin body having a die side and a ball side.

3. The memory package, as set forth in claim 2, wherein the molded resin body comprises:
    a plurality of first mateable alignment features on the die side of the ball grid array; and
    a plurality of second mateable alignment features on the ball side of the ball grid arrays.

4. The memory package, as set forth in claim 3, wherein the plurality of first mateable alignment features are male and the plurality of second mateable alignment features are female.

5. The memory package, as set forth in claim 3, wherein the plurality of first mateable alignment features are male and the plurality of second mateable alignment features are male.

6. The memory package, as set forth in claim 3, wherein the plurality of first mateable alignment features are female and the plurality of second mateable alignment features are male.

7. The memory package, as set forth in claim 3, wherein the plurality of first mateable alignment features are female and the plurality of second mateable alignment features are female.

8. The memory package, as set forth in claim 3, wherein the plurality of first mateable alignment features and the plurality of second mateable alignment features orient adjacent ball grid arrays in a unique location.

9. The memory package, as set forth in claim 8, wherein the plurality of first mateable alignment features and the plurality of second mateable alignment features are arranged asymmetrically.

10. The memory package, as set forth in claim 8, wherein the plurality of first mateable alignment features and the plurality of second mateable alignment features comprising of at least one unique alignment feature.

11. The memory package, as set forth in claim 3, wherein the plurality of first mateable alignment features and the plurality of second mateable alignment features support adjacent ball grid arrays during solder ball reflow.

12. The memory package, as set forth in claim 1, wherein each of the plurality of ball grid arrays is electrically coupled to another of the plurality of ball grid arrays using solder balls.

13. The memory package, as set forth in claim 12, wherein each of the plurality of ball grid arrays comprise vias extending therethrough to electrically connect solder balls of adjacent memory packages serially.

* * * * *